United States Patent
Chen et al.

(10) Patent No.: US 11,670,617 B2
(45) Date of Patent: Jun. 6, 2023

(54) PACKAGES FORMED USING RDL-LAST PROCESS

(71) Applicant: Taiwan Semiconductor Manufacturing Co., Ltd., Hsinchu (TW)

(72) Inventors: Ming-Fa Chen, Taichung (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 16/939,879

(22) Filed: Jul. 27, 2020

(65) Prior Publication Data
US 2020/0357769 A1 Nov. 12, 2020

Related U.S. Application Data

(60) Continuation of application No. 16/204,475, filed on Nov. 29, 2018, now Pat. No. 10,727,201, which is a (Continued)

(51) Int. Cl.
*H01L 25/065* (2023.01)
*H01L 25/00* (2006.01)
(Continued)

(52) U.S. Cl.
CPC ........ *H01L 25/0655* (2013.01); *H01L 23/367* (2013.01); *H01L 23/467* (2013.01); (Continued)

(58) Field of Classification Search
CPC ............... H01L 25/0655; H01L 23/481; H01L 25/50; H01L 23/467; H01L 23/5389; H01L 23/5386; H01L 23/473; H01L 23/367; H01L 2224/83895; H01L 24/26; H01L 24/83; H01L 2224/02311
See application file for complete search history.

(56) References Cited

U.S. PATENT DOCUMENTS 7,385,283 B2 6/2008 Wu et al.
7,538,434 B2 5/2009 Shih et al.
(Continued)

FOREIGN PATENT DOCUMENTS

CN 101000886 A 7/2007
CN 102157402 A 8/2011
(Continued)

*Primary Examiner* — Selim U Ahmed
(74) *Attorney, Agent, or Firm* — Slater Matsil, LLP

(57) ABSTRACT

A method includes bonding a first device die and a second device die to a substrate, and filling a gap between the first device die and the second device die with a gap-filling material. A top portion of the gap-filling material covers the first device die and the second device die. Vias are formed to penetrate through the top portion of the gap-filling material. The vias are electrically coupled to the first device die and the second device die. The method further includes forming redistribution lines over the gap-filling material using damascene processes, and forming electrical connectors over and electrically coupling to the redistribution lines.

20 Claims, 16 Drawing Sheets

Related U.S. Application Data division of application No. 15/693,950, filed on Sep. 1, 2017, now Pat. No. 10,541,228.

(60) Provisional application No. 62/520,112, filed on Jun. 15, 2017.

(51) Int. Cl.
  H01L 23/467 (2006.01)
  H01L 23/473 (2006.01)
  H01L 23/367 (2006.01)
  H01L 23/538 (2006.01)
  H01L 23/48 (2006.01)
  H01L 23/00 (2006.01)
  H01L 23/498 (2006.01)

(52) U.S. Cl.
  CPC .......... H01L 23/473 (2013.01); H01L 23/481 (2013.01); H01L 23/5386 (2013.01); H01L 23/5389 (2013.01); H01L 25/50 (2013.01); *H01L 23/49811* (2013.01); *H01L 23/49816* (2013.01); *H01L 24/26* (2013.01); *H01L 24/83* (2013.01); *H01L 2224/02311* (2013.01); *H01L 2224/18* (2013.01); *H01L 2224/83895* (2013.01)

(56) References Cited

U.S. PATENT DOCUMENTS

| | | | |
|---|---|---|---|
| 9,711,458 | B2 | 7/2017 | Yu et al. |
| 9,728,597 | B2 | 8/2017 | Lin et al. |
| 9,773,768 | B2 | 9/2017 | Yu et al. |
| 9,847,317 | B2 | 12/2017 | Yu et al. |
| 9,972,605 | B2 | 5/2018 | Kwon |
| 2007/0096306 | A1* | 5/2007 | Yamagata ............... H01L 24/19 257/E21.705 |
| 2008/0020565 | A1* | 1/2008 | Tseng ........................ G03F 1/50 430/5 |
| 2008/0029877 | A1 | 2/2008 | Yang et al. |
| 2010/0301431 | A1 | 12/2010 | Ding et al. |
| 2013/0273691 | A1 | 10/2013 | Pascual et al. |
| 2014/0103488 | A1 | 4/2014 | Chen et al. |
| 2014/0216058 | A1 | 8/2014 | Tsuboi et al. |
| 2014/0346671 | A1 | 11/2014 | Yu et al. |
| 2015/0214127 | A1 | 7/2015 | Gu et al. |
| 2015/0318263 | A1 | 11/2015 | Yu et al. |
| 2016/0118326 | A1 | 4/2016 | Kwon |
| 2016/0307862 | A1 | 10/2016 | Lin et al. |
| 2017/0077035 | A1 | 5/2017 | Tao et al. |
| 2017/0125376 | A1 | 5/2017 | Yeh et al. |
| 2018/0190513 | A1 | 7/2018 | Chew |
| 2018/0277485 | A1 | 9/2018 | Han et al. |

FOREIGN PATENT DOCUMENTS

| | | |
|---|---|---|
| CN | 103975431 A | 8/2014 |
| EP | 1418617 A2 | 5/2004 |
| JP | 2002334967 A | 11/2002 |
| KR | 100863364 B1 | 10/2008 |
| KR | 20150137970 A | 12/2015 |
| KR | 20160048300 A | 5/2016 |
| KR | 20160067729 A | 6/2016 |
| KR | 20160123967 A | 10/2016 |
| KR | 20170056404 A | 5/2017 |
| TW | 200633129 A | 9/2006 |
| TW | 200802690 A | 1/2008 |
| TW | 201603202 A | 1/2016 |
| TW | 201712820 A | 4/2017 |
| TW | 201714274 A | 4/2017 |
| TW | 201717335 A | 5/2017 |

\* cited by examiner

PACKAGES FORMED USING RDL-LAST PROCESS

PRIORITY CLAIM AND CROSS-REFERENCE

This application is a continuation of U.S. patent application Ser. No. 16/204,475, entitled "Packages Formed Using RDL-Last Process," and filed Nov. 29, 2018, which is a divisional of U.S. patent application Ser. No. 15/693,950, entitled "Packages Formed Using RDL-Last Process," and filed Sep. 1, 2017, now U.S. Pat. No. 10,541,228 issued Jan. 21, 2020, which claims the U.S. Provisional Patent Application No. 62/520,112, filed Jun. 15, 2017, and entitled "Packages formed Using RDL-Last Process," which applications are hereby incorporated herein by reference.

BACKGROUND

The packages of integrated circuits are becoming increasing complex, with more device dies packaged in the same package to achieve more functions. For example, a package may include a plurality of device dies such as processors and memory cubes bonded to a same interposer. The interposer may be formed based on a semiconductor substrate, with through-silicon vias formed in the semiconductor substrate to interconnect the features formed on the opposite sides of the interposer. A molding compound encapsulates the device dies therein. The package including the interposer and the device dies are further bonded to a package substrate. In addition, surface mount devices may also be bonded to the substrate. A heat spreader may be attached to the top surfaces of the device dies in order to dissipate the heat generated in the device dies. The heat spreader may have a skirt portion fixed onto the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B through 11 illustrate the cross-sectional views of intermediate stages in the formation of packages using Redistribution Line (RDL) last process in accordance with some embodiments.

DETAILED DESCRIPTION

Figure 1A:
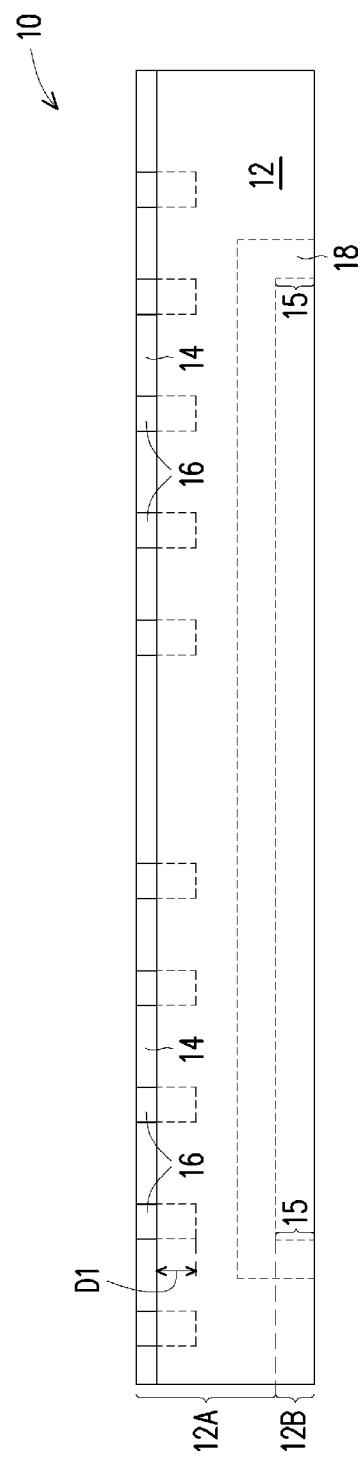

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package formed based on Redistribution Line (RDL) last process and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 15:
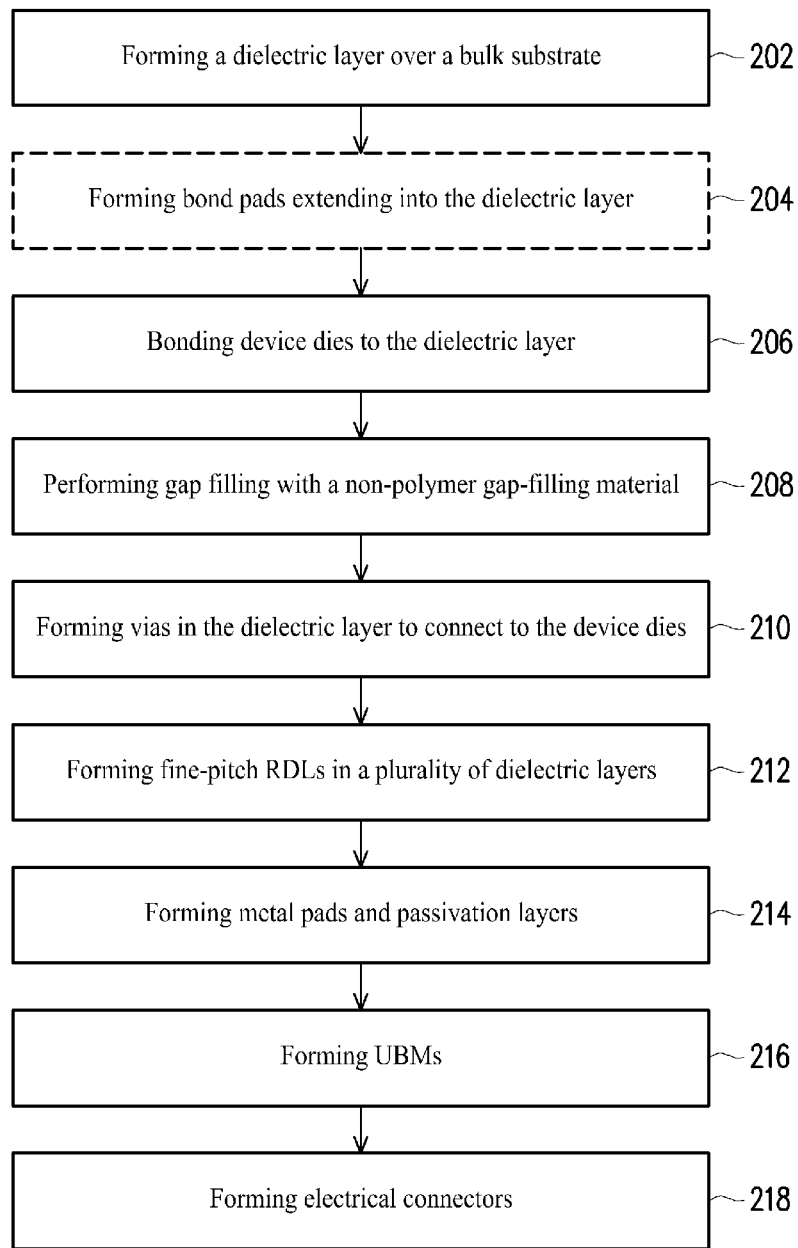
FIG. 15 illustrates a process flow for forming a package in accordance with some embodiments.

FIGS. 1A and 1B through 11 illustrate the cross-sectional views of intermediate stages in the formation of a package using the RDL-last process in accordance with some embodiments of the present disclosure. The steps shown in FIGS. 1A and 1B through 11 are also reflected schematically in the process flow 200 shown in FIG. 15.

FIG. 1A illustrates wafer 10. Wafer 10 includes bulk substrate 12, which may be a silicon substrate, a glass substrate, or a metal substrate. Wafer 10 may have the shape of a typical semiconductor wafer. For example, wafer 10 may have a circular top-view shape, and may have an 8 inch diameter, a 12 inch diameter, or the like. When formed of metal, substrate 12 may be formed of copper, aluminum, stainless steel, or the like. In accordance with some embodiments of the present disclosure, there is no active device (such as transistor and diode) and passive devices (such as capacitor, inductor, and resistor) formed in wafer 10. Wafer 10 has two functions. First, wafer 10 provides mechanical support to the structure that will be formed in subsequent steps since the subsequently bonded device dies are very thin in order to have a good gap filling. Also, substrate 12 may have high thermal conductivity, and hence wafer 10 may act as a heat spreader.

Dielectric layer 14 may be formed at the surface of substrate 12. The respective step is illustrated as step 202 in the process flow shown in FIG. 15. Dielectric layer 14 may be formed of silicon oxide, for example, which may be formed by oxidizing substrate 12 in an oxygen containing environment. Alternatively, dielectric layer 14 is formed by oxidizing substrate 12 in water steam. In accordance with some embodiments of the present disclosure, dielectric layer 14 is formed through the deposition of an oxide such as silicon oxide (which may be formed of tetraethyl orthosilicate (TEOS)), silicon oxynitride, or the like. In accordance with some embodiments of the present disclosure, bond pads 16 are formed in dielectric layer 14. The respective step is illustrated as step 204 in the process flow shown in FIG. 15. The bottom surfaces of bond pads 16 may be coplanar with the illustrated bottom surface of dielectric layer 14 in accordance with some embodiments of the present disclosure. In accordance with alternative embodiments of the present disclosure, bond pads 16 extend into substrate 12, and the portions of bond pads 16 in substrate 12 are shown using dashed lines to indicate that bond pads 16 may or may not extend into substrate 12.

To form bond pads 16, trenches (shown as filled by bond pads 16) are formed by etching dielectric layer 14 and substrate 12, so that the trenches also extend into dielectric layer 14 and substrate 12. Depth D1 of the portions of the trenches inside substrate 12 may be greater than about 1 μm, and may be between about 2 μm and about 20 μm, depending on the thickness of substrate 12. For example, depth D1 may be between about 20 percent and about 60 percent of the thickness of substrate 12. It is appreciated that the values recited throughout the description are examples, and may be changed to different values.

The trenches are then filled to form bond pads 16, as shown in FIG. 1A. It is appreciated that although features 16 are referred to as bond pads, features 16 may be discrete pads or interconnected metal lines. In accordance with some embodiments, bond pads 16 are formed of copper or other metals suitable for hybrid bonding (due to relatively easiness in diffusing). After the filling, a planarization is performed to planarize the top surfaces of bond pads 16 with the top surface of dielectric layer 14. The planarization may include a Chemical Mechanical Polish (CMP) process or a mechanical grinding process.

The trenches (and the resulting bond pads 16) may be distributed in various patterns. For example, the trenches may be formed as discrete openings, which may be allocated as an array, a pattern of beehive, or other repeat patterns. The top-view shapes of the trenches may be rectangles, squares, circles, hexagons, or the like. In accordance with alternative embodiments of the present disclosure, the trenches, when viewed in the top view of the structure shown in FIG. 1A, may be parallel trenches that extend in a single direction. The trenches may also be interconnected to form a grid. The grid may include a first plurality of trenches parallel to each other and evenly or unevenly spaced, and a second plurality of trenches parallel to each other and evenly or unevenly spaced. The first plurality of trenches and the second plurality of trenches intercept with each other to form the grid, and the first plurality of trenches and the second plurality of trenches may or may not be perpendicular to each other in the top view.

Figure 1B:
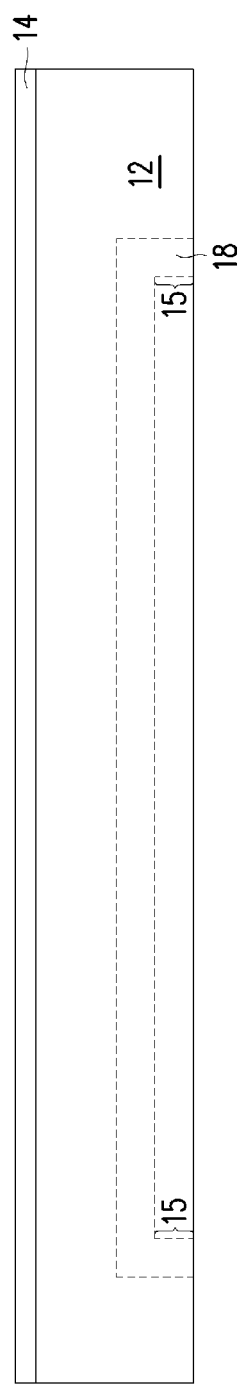

In accordance with alternative embodiments of the present disclosure, no metal bond pads are formed in dielectric layer 14 and substrate 12. Accordingly, substrate 12 is a blank substrate formed of a homogenous material (a semiconductor, glass, or a metal), and dielectric layer 14 is a blanket planar layer, as shown in FIG. 1B.

In accordance with some embodiments of the present disclosure, micro-trenches 18 are formed in substrate 12. Micro-trenches 18 are voids in which a coolant such as oil, water, gas, or the like can flow therein. The formation of micro-trenches 18 may include etching a first substrate (such as substrate 12A in FIG. 1A) to form micro-trenches, and covering the micro-trenches with another substrate (such as substrate 12B) to seal the micro-trenches, wherein openings 15 are formed in substrate 12B to connect to micro-trenches 18. Micro-trenches 18 are illustrated using dashed lines to indicate they may or may not be formed.

Figure 2:
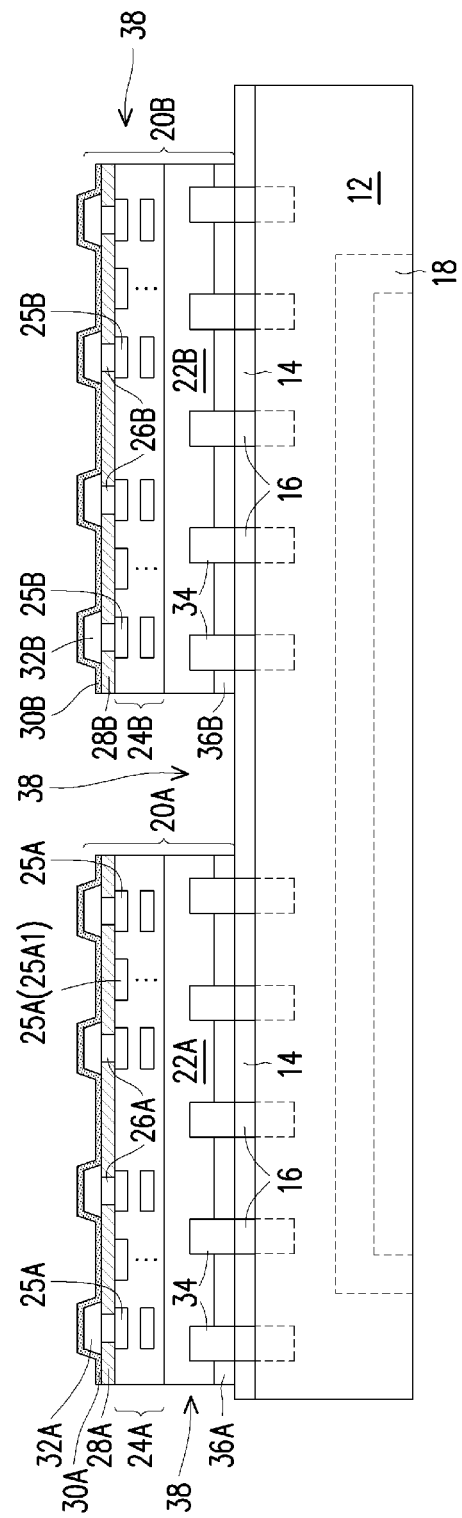

Referring to FIG. 2, package components 20A and 20B are bonded to wafer 10. The respective step is illustrated as step 206 in the process flow shown in FIG. 15. Package components 20A and 20B may be device dies or packages.

In accordance with some embodiments of the present disclosure, package components 20A and 20B include one or more logic die, which may be selected from a Central Processing Unit (CPU) die, a Micro Control Unit (MCU) die, an input-output (IO) die, a BaseBand (BB) die, or an Application processor (AP) die. Package components 20A and 20B may also include one or more memory die. In subsequent discussion, package components 20A and 20B are referred to as device dies as an example, while they can be other types of devices such as packages, die stacks, memory cubes, or the like. Also, although package components 20A and 20B are illustrated as having the same structure, they may have different circuits, different sizes, different thicknesses, and/or may include different number of device dies therein.

Device dies 20A and 20B include semiconductor substrates 22A and 22B, respectively, which may be silicon substrates. Also, device dies 20A and 20B may include interconnect structures 24A and 24B, respectively, for connecting to the active devices and passive devices in device dies 20A and 20B. Interconnect structures 24A and 24B include metal lines and vias (not shown). Furthermore, the dielectric layers, in which the metal lines and vias of interconnect structures 24A and 24B are formed, may be formed using low-k dielectric materials having dielectric constants (k-values) lower than about 3.0, lower than about 2.5, or even lower. The dielectric material may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, the dielectric layers in interconnect structures 24A and 24B are formed of an oxide based dielectric material such as silicon oxide or silicon oxynitride.

Interconnect structures 24A and 24B include metal pads 25A and 25B, respectively, which are in the top metal layer of the interconnect structures. Passivation layers 28A and 28B (alternatively referred to as passivation-1) may be formed overlying interconnect structures 24A and 24B, respectively. In accordance with some embodiments of the present disclosure, passivation layers 28A and 28B are formed of inorganic dielectric materials such as silicon oxide or silicon nitride, and may have a single-layer structure or a composite structure. The composite structure may include, for example, a silicon oxide layer and a silicon nitride layer over the silicon oxide layer. Metal pads 32A and 32B are formed over passivation layers 28A and 28B, respectively, and are connected to the underlying devices through vias 26A and 26B, which are formed in passivation layers 28A and 28B, respectively.

In accordance with some embodiments of the present disclosure, metal pads 32A and 32B are formed of aluminum or aluminum copper, and hence are sometimes referred to as aluminum pads. Over metal pads 32A and 32B, passivation layers 30A and 30B (alternatively referred to as passivation-2) are formed, which may be formed using materials selected from the same candidate materials for forming passivation layers 28A and 28B.

Device die 20A may include bond pads 34 and dielectric layer 36A at the illustrated bottom surface of device die 20A. The illustrated bottom surfaces of bond pads 34 are coplanar with the illustrated bottom surface of dielectric layer 36A. Device die 20B includes bond pads 34 and dielectric layer 36B at the illustrated bottom surface. The illustrated bottom surfaces of bond pads 34 are coplanar with the illustrated bottom surface of dielectric layer 36B. The formation process of dielectric layers 36A/36B and bond pads 34 may be similar to the formation of dielectric layer 14 and bond pads 16, respectively. Dielectric layers 36A and 36B may be formed of silicon oxide or other oxygen-containing dielectric materials such as silicon oxynitride, for example. The pattern and the horizontal sizes of bond pads 36A and 36B may be the same as or similar to that of the respective bond pads 16, to which bond pads 36A and 36B are bonded. Advantageously, bond pads 34, by contacting (and even inserted into) substrates 22A and 22B, provide a good thermal dissipating path, so that the heat generated in device dies 20A and 20B can easily dissipate into bulk substrate 12 through bond pads 16.

Device dies 20A and 20B are thin dies, for example, with thicknesses between about 15 µm and about 30 µm. With device dies 20A and 20B being thin, the aspect ratio of gap 38 between neighboring device dies 20A and 20B are kept low in order to achieve good gap filling. Otherwise, the gap filling is difficult due to the otherwise high aspect ratio.

The bonding of device dies 20A and 20B to the underlying structure may be achieved through hybrid bonding. For example, bond pads 34 are bonded to bond pads 16 through metal-to-metal direct bonding. In accordance with some embodiments of the present disclosure, the metal-to-metal direct bonding is copper-to-copper direct bonding. Furthermore, dielectric layers 36A and 36B are bonded to dielectric layer 14, for example, with Si—O—Si bonds. The hybrid bonding may include a pre-bonding followed by an anneal, so that the metals in bond pads 34 inter-diffuse with the metals in the respective underlying bond pads 16 to form metal-to-metal direct bonding.

In accordance with alternative embodiments, as shown in FIG. 1B, no bond pads are formed in wafer 10. Accordingly, the bond pads 36A and 36B as shown in FIG. 2 are also not formed, and the bonding of device dies 20A and 20B to dielectric layer 14 is through fusion bonding (dielectric-to-dielectric bonding).

In accordance with alternative embodiments of the present disclosure, substrate 12 is a glass substrate or a metal substrate. Accordingly, layer 14 may be formed of a Thermal Interface Material (TIM), which is an adhesive having a high thermal conductivity. Device dies 20A and 20B are thus adhered to substrate 12 through TIM 14 (refer to FIG. 12). In accordance with these embodiments, dielectric layers 36A and 36B in FIG. 1 may not be formed, and bond pads 34 may or may not be formed.

Figure 3:
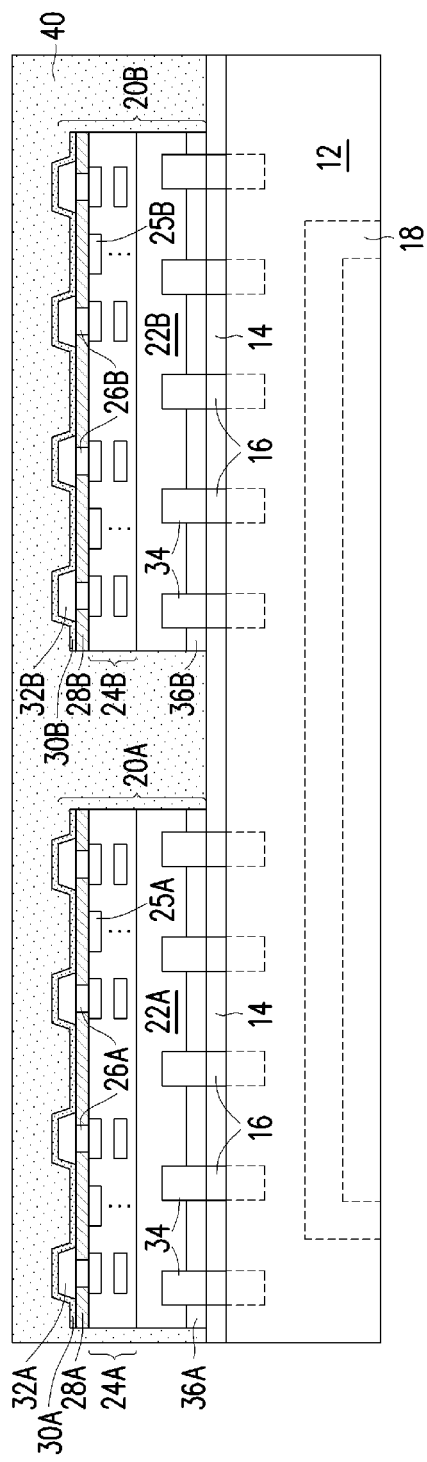

Next, gaps 38 are filled by gap-filling material 40, as shown in FIG. 3. The respective step is illustrated as step 208 in the process flow shown in FIG. 15. In accordance with some embodiments of the present disclosure, gap-filling material 40 includes an inorganic dielectric, which may be an oxide-based dielectric such as silicon oxide. For example, the silicon oxide may be formed of TEOS. The formation method may include Chemical Vapor Deposition (CVD), High-Density Plasma Chemical Vapor Deposition (HDPCVD), or the like. In accordance with some embodiments of the present disclosure, gap-filling material 40 is a non-polymer material, which does not comprise polymers such as polybenzoxazole (PBO), polyimide, benzocyclobutene (BCB), or the like. The polymers have significantly different Coefficient of Thermal Expansion (CTE) than device dies, and will cause warpage of the resulting package and the difficulty in the formation of subsequent fine-pitch RDLs.

A planarization step is then performed to remove excess portions of gap-filling material 40, so that the top surface of gap-filling material 40 becomes planar. A top layer of gap-filling material 40 is left directly over device dies 20A and 20B. In the resulting structure, gap-filling material 40 may be in contact with the top surface of dielectric layer 14, and encircles each of device dies 20A and 20B. Furthermore, gap-filling material 40 may be in contact with the top surface of passivation layers 30A and 30B.

In accordance with some embodiments of the present disclosure, there is no polymer layer (such as polyimide, PBO, BCB, molding compound, underfill, molding underfill, etc.) in the structure shown in FIG. 3. For example, device dies 20A and 20B are free from polymer layers, and the underlying wafer 10 is also free from polymer. Accordingly, the structure shown in FIG. 3 is free from the CTE mismatch problem, which is resulted due to the difference between the significant difference between the polymers and silicon/silicon oxide, etc. It is thus feasible to form fine-pitch RDLs over the structure shown in FIG. 3 using the processes (such as damascene processes) and materials (such as copper and/or low-k dielectric) for forming interconnect structures in device wafers.

Figure 4:
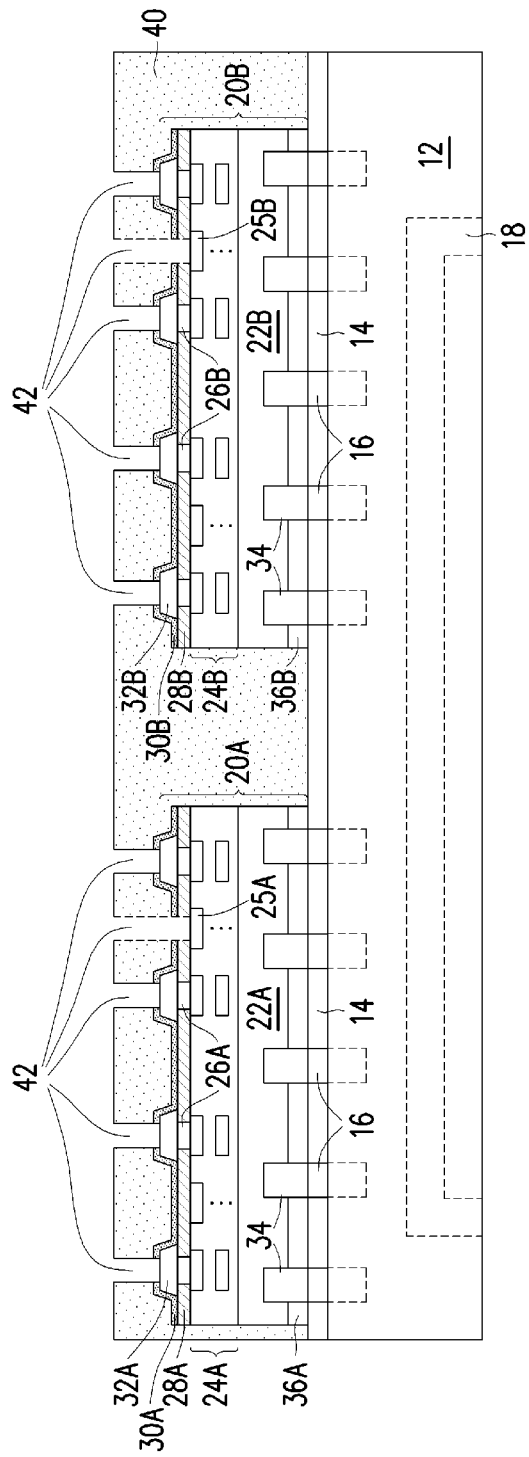

Referring to FIG. 4, gap-filling material 40 and passivation layers 30A and 30B are etched to form via openings 42. In accordance with some embodiments of the present disclosure, metal pads 32A and 32B are exposed to via openings 42. In accordance with alternative embodiments of the present disclosure, some or all of via openings 42 further penetrate through passivation layer 28A and/or 28B, so that some top metal pads 25A and/or 25B are exposed to via openings 42. In accordance with yet alternative embodiments of the present disclosure, top metal pads 25A and/or 25B are exposed to some of via openings 42, while metal pads 32A and/or 32B are exposed to some other via openings 42. The top-view shapes of via openings 42 may be, and are not limited to, rectangles, circles, hexagons, or the like.

Figure 5:
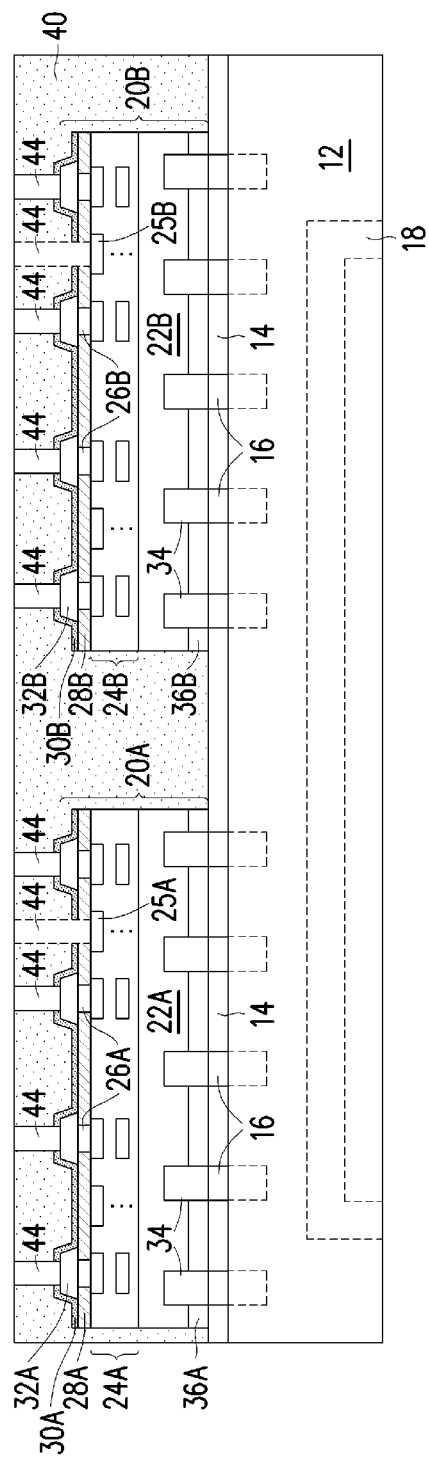

Next, via openings 42 are filled with a conductive material(s) to form vias 44, and the resulting structure is shown in FIG. 5. The respective step is illustrated as step 210 in the process flow shown in FIG. 15. In accordance with some embodiments of the present disclosure, vias 44 are formed of a homogenous conductive material, which may be a metal or a metal alloy including copper, aluminum, tungsten, or the like. In accordance with alternative embodiments of the present disclosure, vias 44 have a composite structure including a conductive barrier layer formed of titanium, titanium nitride, tantalum, tantalum nitride, or the like, and a metal-containing material (such as copper or a copper alloy) over the conductive barrier layer. In accordance with some embodiments of the present disclosure, a dielectric isolation layer is formed to encircle each of vias 44. In accordance with alternative embodiments, no dielectric isolation layers are formed to encircle vias 44, and vias 44 are in physical contact with gap-filling material 40. The formation of vias 44 also include depositing the conductive material into via openings 42 (FIG. 4), and performing a planarization to remove excess portions of the deposited material over gap-filling material 40.

It is appreciated that metal pads 32A and 32B may be used for testing (probing) purpose when device dies 20A and 20B are manufactured. In accordance with some embodiments of the present disclosure, some metal pads 32A and 32B may no longer be used after the testing, and hence there may not be any via 44 over and contacting the respective metal pads 32A and/or 32B. Top metal pads 25A and/or 25B are instead used for connecting to the overlying structures in accordance with these embodiments. In accordance with alternative embodiments, some or all of metal pads 32A and 32B are used for both testing and signal connection, and hence vias 44 are formed to connect to them, as shown in FIG. 5. Vias 44 may also include some vias 44 connected to metal pads 32A and/or 32B, and other vias 44 connected to top metal pads 25A and/or 25B.

Figure 6:
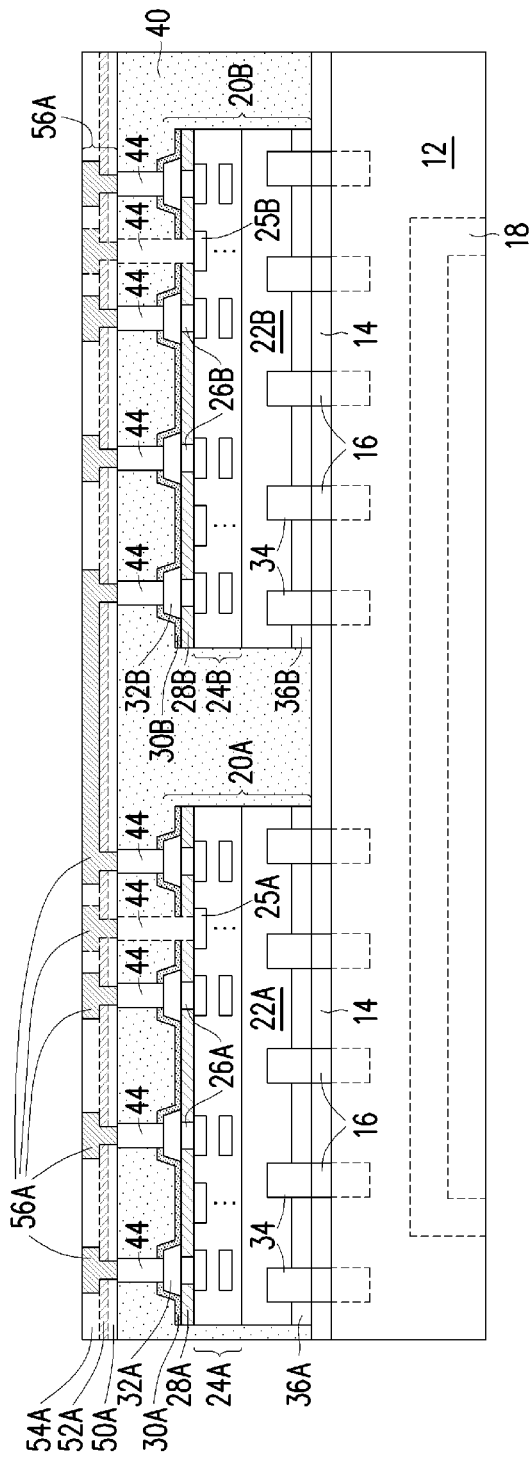
Figure 7:
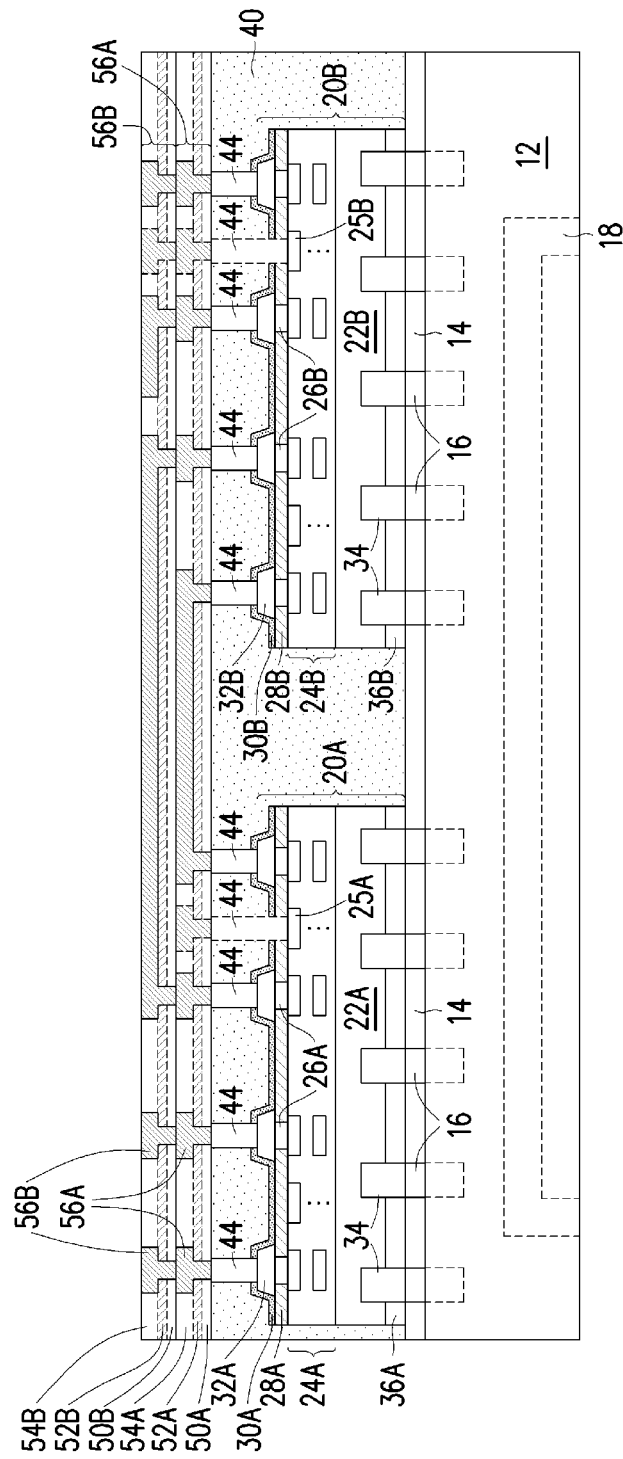
Figure 8:
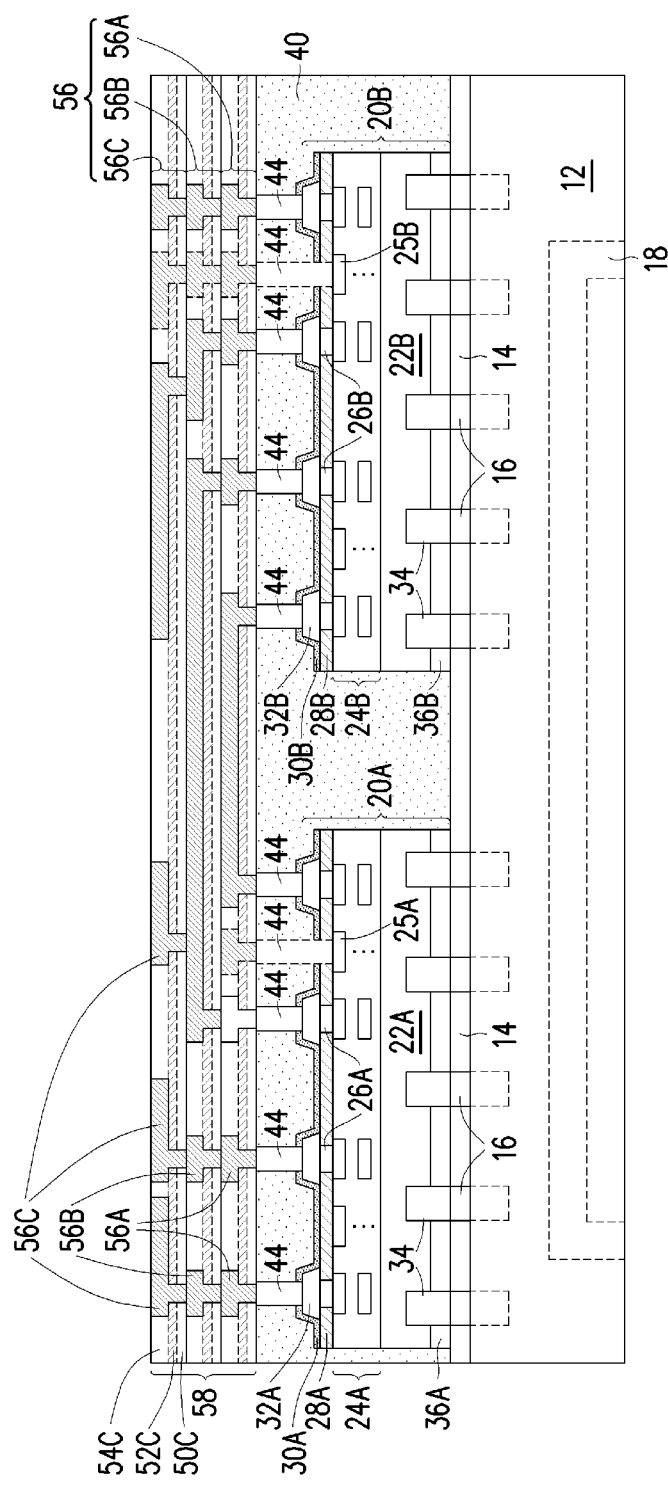

FIGS. 6, 7, and 8 illustrate exemplary processes for forming fine-pitch RDLs. The respective step is illustrated as step 212 in the process flow shown in FIG. 15. Referring to FIG. 6, dielectric layers 50A and 54A and etch stop layer 52A are formed. Dielectric layers 50A and 54A may be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. Etch stop layer 52A is formed of a material having a high etching selectivity relative to dielectric layers 50A and 54A, and may be formed of silicon carbide, silicon carbo-nitride, etc. In accordance with alternative embodiments, etch stop layer 52A is not formed. Accordingly, etch stop layer 52A is illustrated using dashed lines to indicate it may or may not be formed.

Fine-pitch RDLs 56A are formed in dielectric layers 52A and 54A for routing. Since the fine-pitch RDLs in accordance with some embodiments of the present disclosure are formed using damascene processes, it can be formed very thin (narrow in a top view) with fine pitches (viewed from the top of the structure) smaller than, for example, 0.8 μm. In accordance with some embodiments, fine-pitch RDLs 56A are formed using a dual damascene process, which includes etching dielectric layer 54A to form trenches, and etching dielectric layers 50A and 52A to form via openings. The trenches and via openings are then simultaneously filled with conductive material(s). A planarization step such as CMP or mechanical grinding is then performed to remove the portions of the conductive material over dielectric layer 54A.

Figure 14:
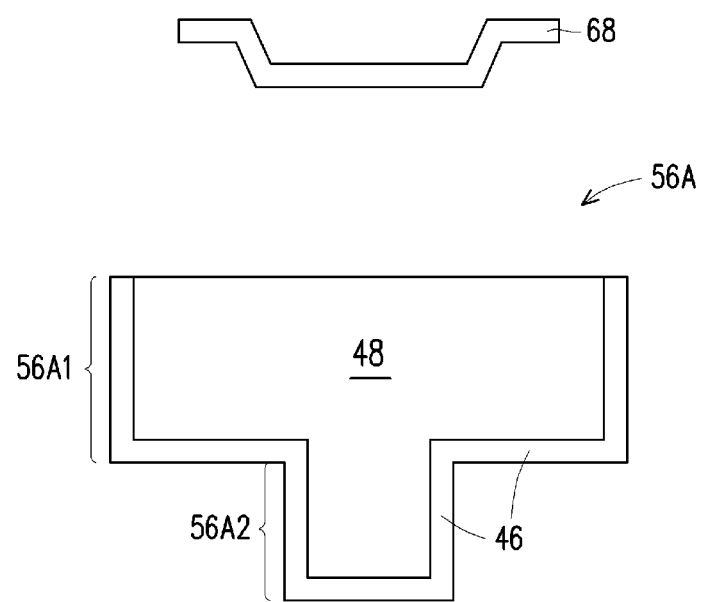
FIG. 14 illustrates a dual damascene structure and an Under-Bump metallurgy (UBM) in a package in accordance with some embodiments.

FIG. 14 illustrates a amplified view of an exemplary structure of one of fine-pitch RDLs 56A, which includes metal line 56A1 and via 56A2 underlying and connected to metal line 56A1. Metal line 56A1 and via 56A2 in combination include diffusion barrier layer 46, and metallic material 48 over diffusion barrier layer 46. In accordance with some embodiments of the present disclosure, diffusion barrier layer 46 is formed of titanium, titanium nitride, tantalum, or tantalum nitride. Metallic material 48 may be formed of copper or a copper alloy. Due to the dual damascene structure, diffusion barrier layer 46 continuously extends into metal line 56A1 and via 56A2.

FIG. 7 illustrates the formation of dielectric layers 50B and 54B and etch stop layer 52B. The materials of dielectric layers 50B and 54B may be selected from the same candidate materials for forming dielectric layers 50A and 54A, and the material of etch stop layer 52B may be selected from the same candidate materials for forming etch stop layer 52A.

Fine-pitch RDLs 56B are also formed in dielectric layers 50B, 52B, and 54B. Fine-pitch RDLs 56B include metal lines formed in dielectric layers 54B and vias formed in dielectric layers 50B and 52B. The formation may include a dual damascene process, which include forming trenches in dielectric layer 54B and via openings in dielectric layers 50B and 52B, filling a conductive material(s), and then performing a planarization such as mechanical grinding or CMP. Similarly, fine-pitch RDLs 56B may be formed of a composite material including a diffusion barrier layer and a copper-containing material over the diffusion barrier layer, similar to what is shown in FIG. 14.

FIG. 8 illustrates the formation of dielectric layers 50C and 54C, etch stop layer 52C, and fine-pitch RDLs 56C. The formation method and the materials may be similar to the underlying respective layers, and hence are not repeated herein. Also, etch stop layers 52A, 52B, and 52C may be omitted in accordance with some embodiments, and the corresponding etching for forming trenches may be performed using a time-mode to control the depths of the trenches. It is appreciated that there may be more dielectric layers and metal layers formed for fine-pitch RDLs. In addition, even if some or all of etch stop layers 52A, 52B, and 52C may be skipped, since the dielectric layers in which the fine-pitch RDLs are located are formed in different processes, there may be distinguishable interfaces between the dielectric layers for forming fine-pitch RDLs 56A, 56B, and 56C, regardless of whether these dielectric layers are formed of the same dielectric material or different dielectric materials. In subsequent paragraphs, dielectric layers 50A, 52A, 54A, 50B, 52B, 54B, 50C, 52C, and 54C are collectively and individually referred to as dielectric layers 58 for the simplicity in identification. Fine-pitch RDLs 56A, 56B, and 56C are also collectively and individually referred to as fine-pitch RDLs 56. RDLs 56B and 56C may have similar dual damascene structures as RDL 56A shown in FIG. 14.

Fine-pitch RDLs 56A, 56B, and 56C electrically interconnect device dies 20A and 20B. Since the pitches of fine-pitch RDLs 56A, 56B, and 56C are very small, more fine-pitch RDLs 56A, 56B, and 56C may be formed as the interconnection between device dies 20A and 20B. This significantly improves the density of the fine-pitch RDLs and the routing ability.

Figure 9:
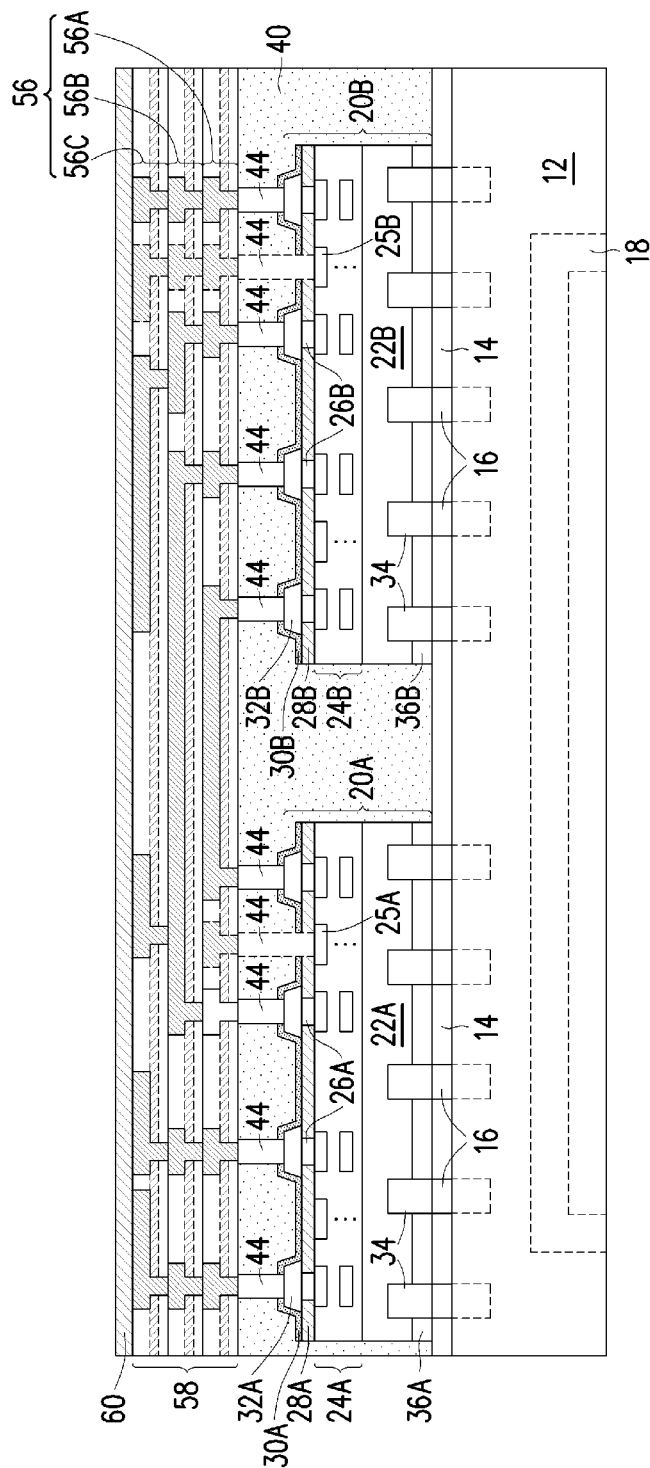
Figure 10:
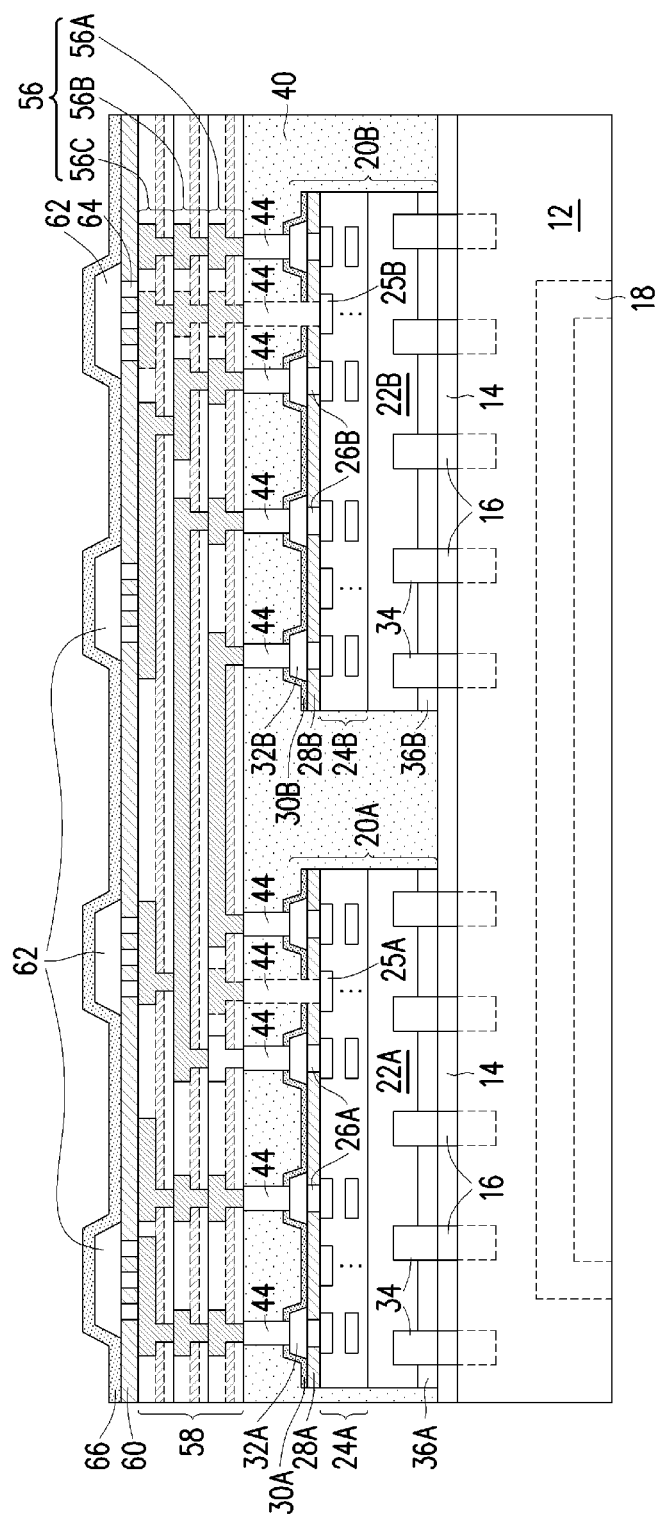

FIGS. 9 and 10 illustrate the formation of passivation layers and RDLs. The respective step is illustrated as step 214 in the process flow shown in FIG. 15. Referring to FIG. 9, passivation layer 60 (sometimes referred to as passivation-1) is formed over dielectric layers 58, wherein vias 64 are formed in passivation layer 60 to electrically connect fine-pitch RDLs 56C to the overlying metal pads.

Referring to FIG. 10, metal pads 62 are formed over passivation layer 60, and are electrically coupled to fine-pitch RDLs 56C through vias 64 in passivation layer 60. Metal pads 62 may be aluminum pads or aluminum-copper pads, and other metallic materials may be used.

As also shown in FIG. 10, passivation layer 66 (sometimes referred to as passivation-2) is formed over passivation layer 60. Each of passivation layers 60 and 66 may be a single layer or a composite layer, and may be formed of a non-porous material. In accordance with some embodiments of the present disclosure, one or both of passivation layers 60 and 66 is a composite layer including a silicon oxide layer (not shown separately), and a silicon nitride layer (not shown separately) over the silicon oxide layer. Passivation layers 60 and 66 may also be formed of other non-porous dielectric materials such as Un-doped Silicate Glass (USG), silicon oxynitride, and/or the like.

Figure 11:
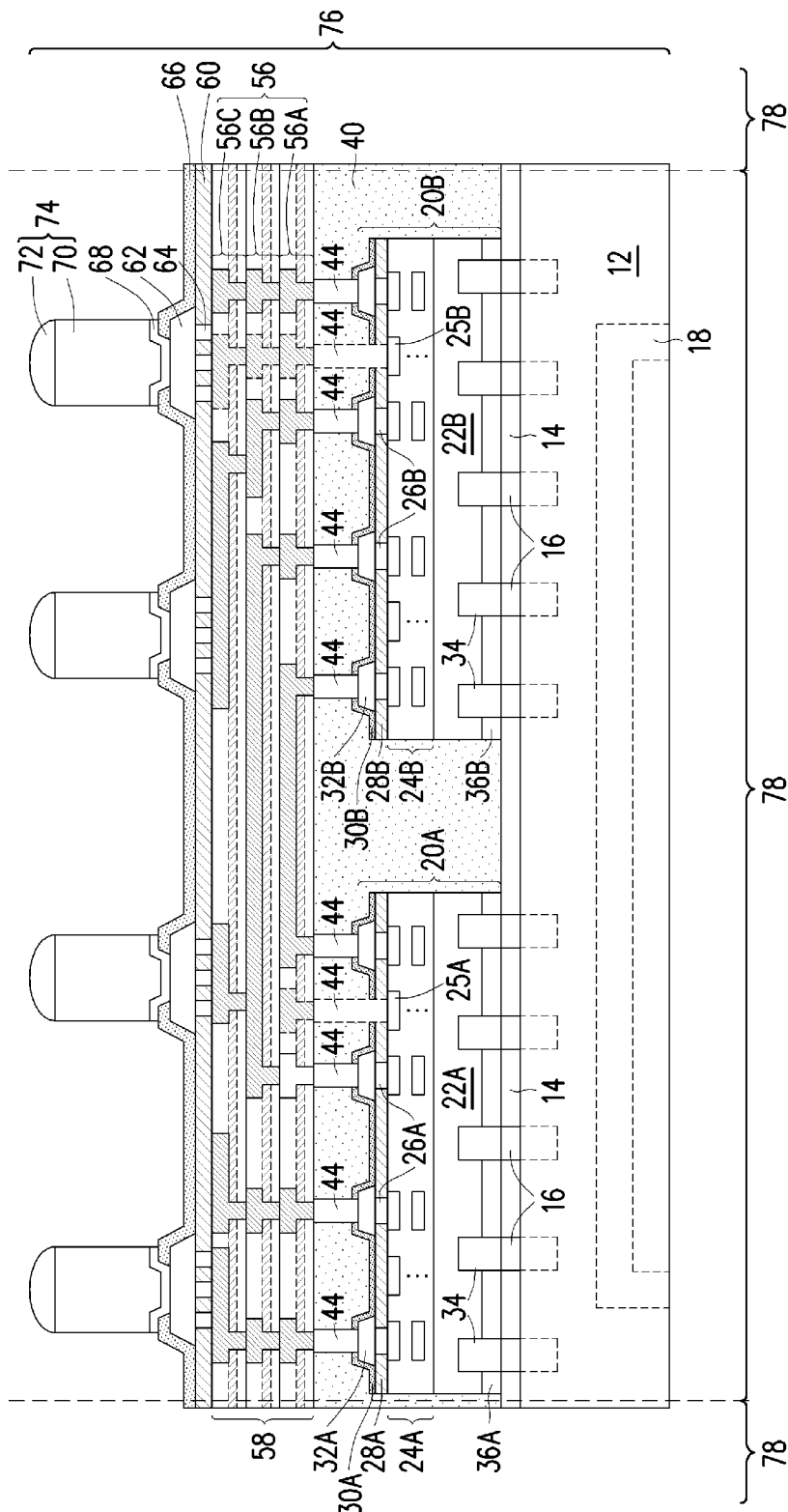

Next, as shown in FIG. 11, passivation layer 66 is patterned, so that some portions of passivation layer 66 cover the edge portions of metal pads 62, and central portions of metal pads 62 are exposed through the openings in passivation layer 66. Under-bump metallurgies (UBMs) 68 are formed, and UBMs 68 extend into passivation layer 66. The respective step is illustrated as step 216 in the process flow shown in FIG. 15. UBMs 68 may be in contact with metal pads 62. In accordance with some embodiments of the present disclosure, each of UBMs 68 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 68. In accordance with some embodiments of the present disclosure, UBMs 68 are formed using Physical Vapor Deposition (PVD) or other applicable methods.

As also shown in FIG. 11, electrical connectors 74 are formed. The respective step is illustrated as step 218 in the process flow shown in FIG. 15. An exemplary forming process for forming UBMs 68 and electrical connectors 74 includes depositing a blanket UBM layer, forming and patterning a mask (which may be a photo resist, not shown), with portions of the blanket UBM layer being exposed through the opening in the mask. After the formation of UBMs 68, the illustrated package is placed into a plating solution (not shown), and a plating step is performed to form electrical connectors 74 on UBMs 68. The plating may be an electro-plating, an electroless-plating, an immersion plating, or the like. In accordance with some exemplary embodiments of the present disclosure, electrical connectors 74 include non-solder parts 70, which are not molten in the subsequent reflow processes. The non-solder parts 70 may be formed of copper, and hence are referred to as copper bumps 70 hereinafter, although they may be formed of other non-solder materials. Each of electrical connectors 74 may also include cap layer(s) (not shown) selected from a nickel layer, a nickel alloy, a palladium layer, a gold layer, a silver layer, or multi-layers thereof. The cap layer(s) are formed over copper bumps 70. Electrical connectors 74 may further include solder caps 72, which may be formed of a Sn—Ag alloy, a Sn—Cu alloy, a Sn—Ag—Cu alloy, or the like, and may be lead-free or lead-containing. The structure formed in preceding steps is referred to as composite wafer 76.

A die-saw step is performed on composite wafer 76 to separate composite wafer 76 into a plurality of packages 78. Packages 78 are identical to each other, and each of packages 104 includes both device dies 20A and 20B, a piece of substrate 12, and the overlying interconnect structures.

Figure 12:
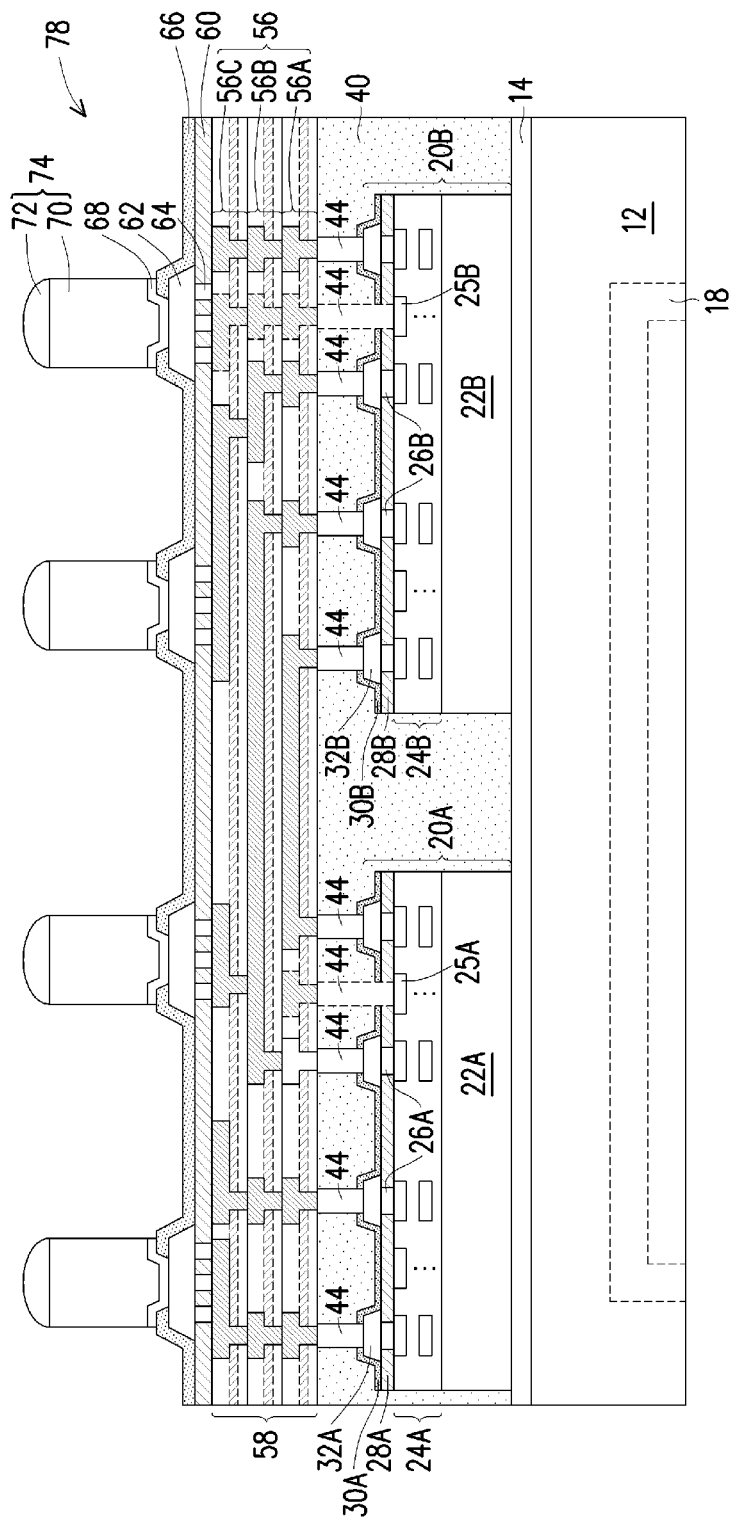
FIGS. 12 and 13 illustrate the cross-sectional views of some packages formed using RDL-last process in accordance with some embodiments.

FIG. 12 illustrates package 78 formed in accordance with some embodiments of the present disclosure. These embodiments are similar to the embodiments shown in FIG. 11, except that bond pads 16 and 34 and dielectric layers 36A/36B (as in FIG. 11) are not formed in the embodiments shown in FIG. 12. In accordance with some embodiments of the present disclosure, as shown in FIG. 12, bulk substrate 12, which is also a blank die, is bonded to dielectric layer 14 through fusion bonding or adhesion. The formation of dielectric layer 14 has been discussed referring to FIG. 1B. In accordance with some embodiments of the present disclosure, layer 14 is an oxide-based dielectric layer such as a silicon oxide layer, and the bonding from layer 14 to substrate 12 and substrates 22A and 22B may be fusion bonding. In accordance with alternative embodiments of the present disclosure, layer 14 is an adhesive film such as a TIM, which has a high thermal conductivity (for example, higher than about 1 W/mk), and substrate 12 may be a glass substrate or a metal substrate.

Figure 13:
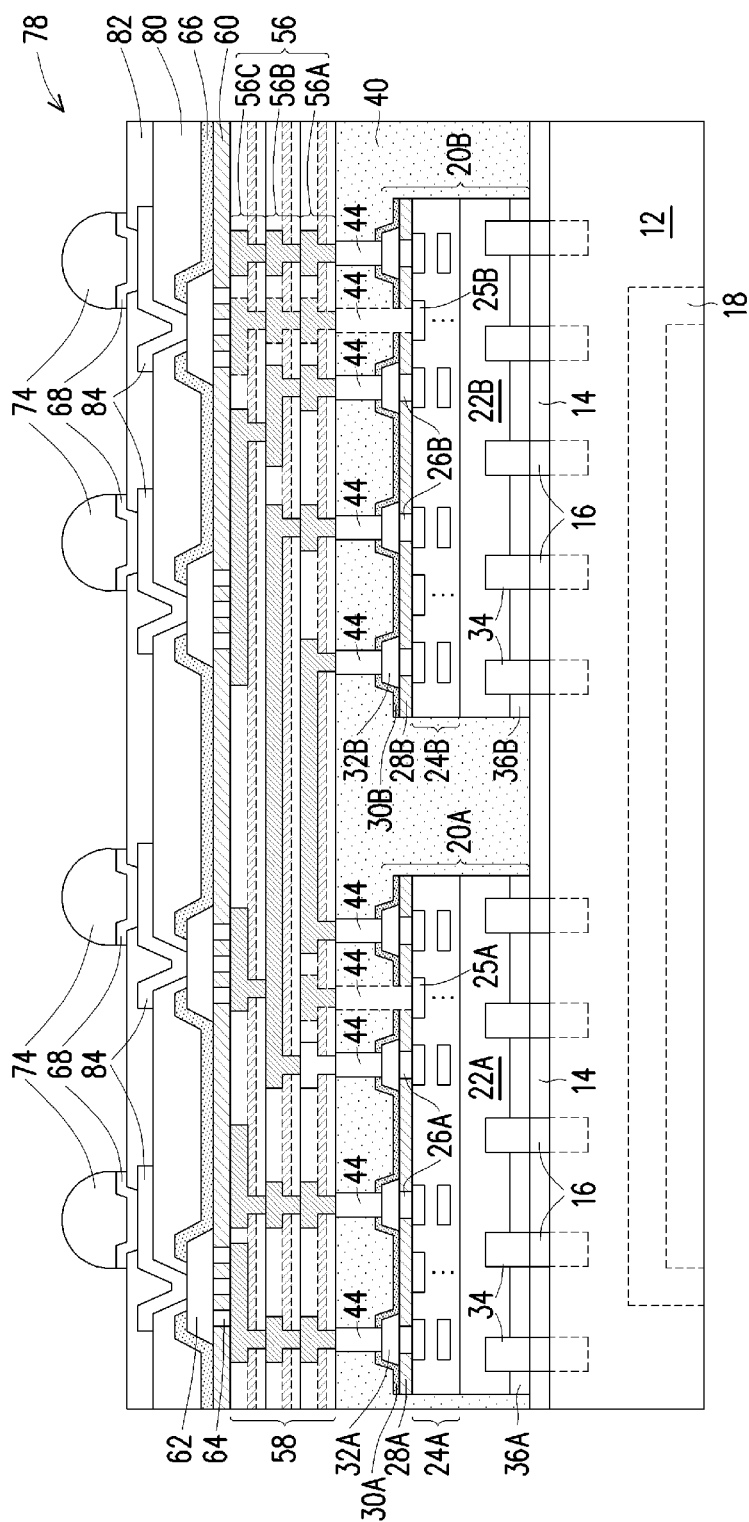

FIG. 13 illustrates package 78 formed in accordance with some embodiments of the present disclosure. These embodiments are similar to the embodiments shown in FIG. 11, except the electrical connectors 74 are solder regions (sometimes referred to as C4 bumps). Polymer layers may be formed to absorb stress. For example, as shown in FIG. 13, polymer layer 80 is formed over passivation layer 66. Polymer layer 80 may be formed of polyimide, PBO, BCB, or the like. The formation methods may include spin coating, for example. Polymer layer 80 may be dispensed in a flowable form, and then cured. Polymer layer 80 is patterned to expose the center portions of metal pads 62.

Next, Post-Passivation Interconnects (PPIs) 84 is formed to fill the openings in polymer layer 80. PPIs 84 are in contact with the top surfaces of metal pads 62. In accordance with some embodiments of the present disclosure, the formation of PPIs 84 includes depositing a seed layer (not shown), and then plating a metal layer over the seed layer. The seed layer may include a titanium layer and a copper layer (both may be conformal layers) over the titanium layer. The seed layer may be deposited using Physical Vapor Deposition (PVD). The plated conductive material over the seed layer may include a copper layer, a gold layer, or a copper layer and a gold layer over the copper layer. The plating may be performed using, for example, Electro-Chemical Plating (ECP) or Electro-less (E-less) plating.

Next, polymer layer 82 is formed to cover PPIs 84. Polymer layer 82 may also be formed of polyimide, PBO, BCB, or the like. Next, UBMs 68 are formed, followed by placing solder balls, and then reflowing the solder balls to form solder regions 74.

FIG. 14 illustrates an amplified view of one of RDL 56A (with RDLs 56B and 56C having a similar structure) and one of UBMs 68, which are extracted from FIGS. 11, 12, and 13, with other features in FIGS. 11, 12, and 13 are not shown for simplicity. It is observed that both diffusion barrier layer 46 and UBM 68 have openings facing the same direction (facing up in FIG. 14), and the openings face electrical connectors 74 (FIGS. 11, 12, and 13). Stress is generated when package 78 (FIGS. 11, 12, and 13) is bonded to another device such as a device die, an interposer, or a package substrate, and the stress propagate from the joining point to diffusion barrier layer 46 and UBM 68. With diffusion barrier layer 46 and UBM 68 having openings facing the stress generating point, diffusion barrier layer 46 and UBM 68 can absorb stress better without passing the stress down to underlying structures. If, however, one of diffusion barrier layer 46 and UBM 68 has its opening facing away from electrical connectors 74, the stress-absorbing ability of the respective one of diffusion barrier layer 46 and UBM 68 is degraded.

The package 78 as shown in FIGS. 11, 12, and 13, when having built-in micro-channels 18, may have pipes (not shown) connected to the opposite ends (such as the illustrated left end and right end), and a coolant may be conducted into the micro-channels to conduct the heat generated in device dies 20A and 20B away.

Some exemplary processes and features for three-dimensional (3D) packaging are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming the fine-pitch RDLs using the processes typically used on silicon wafers (such as damascene processes), the fine-pitch RDLs may be formed to be thin (narrow) enough to provide the capability for the communication of two or more device dies, all through the fine-pitch RDLs. In conventional processes, fine-pitch RDLs were not feasible using RDL-last process (after device bonding, molding and planarization). It has been found that the CTE mismatch causes the fin-pitch RDLs, if formed, to break due to the stress. In accordance with some embodiments of the present disclosure, no polymer or molding compound is used underlying the fine-pitch RDL. Instead, oxide-based materials such as silicon oxide are used. This significantly reduces CTE mismatch, and makes the RDL-last process possible. There are also some heat-dissipating mechanisms built in the package for better heat dissipation.

In accordance with some embodiments of the present disclosure, a method includes bonding a first device die and a second device die to a substrate, and filling a gap between the first device die and the second device die with a gap-filling material. A top portion of the gap-filling material covers the first device die and the second device die. Vias are formed to penetrate through the top portion of the gap-filling material. The vias are electrically coupled to the first device die and the second device die. The method further includes forming redistribution lines over the gap-filling material using damascene processes, and forming electrical connectors over and electrically coupling to the redistribution lines. The method of claim 1, wherein the filling the gap comprises depositing an oxide. In an embodiment, the bonding the first device die and the second device die to the substrate comprises fusion bonding. In an embodiment, the method includes forming a first plurality of bond pads extending into the substrate, wherein the substrate is a blank semiconductor substrate; and forming a second plurality of bond pads extending into semiconductor substrates of the first device die and the second device die, wherein the bonding further comprises bonding the first plurality of bond pads to the second plurality of bond pads through metal-to-metal direct bonding. In an embodiment, the forming the redistribution lines comprises forming a plurality of metal lines and vias interconnecting the first device die and the second device die. In an embodiment, no polymer is formed between the substrate and the redistribution lines. In an embodiment, the method includes sawing the gap-filling material and the substrate into a same package. In an embodiment, both the first device die and the second device die are in the same package. In an embodiment, the method includes forming a micro-channel in the substrate, wherein the micro-channel is configured to conduct a coolant. In an embodiment, the forming the vias comprises: etching the gap-filling material and a passivation layer in the first device die to form a via opening, wherein a top metal pad is exposed to the via opening, and the top metal pad is in a low-k dielectric layer of the first device die; and filling the via opening with a conductive material.

In accordance with some embodiments of the present disclosure, a method includes attaching a first device die and a second device die to a heat spreader; filling a gap between the first device die and the second device die with a dielectric material, wherein a top portion of the dielectric material covers the first device die and the second device die; forming vias penetrating through the top portion of the dielectric material, wherein the vias are electrically coupled to the first device die and the second device die; forming a plurality of dielectric layers over the dielectric material; forming redistribution lines in the plurality of dielectric layers using dual damascene processes; forming electrical connectors over and electrically coupling to the redistribution lines; and performing a die saw to cut through the heat spreader, the dielectric material, and the plurality of dielectric layers to form a plurality of packages. In an embodiment, after the die saw, the first device die and the second device die are in a same package in the plurality of packages. In an embodiment, the redistribution lines are fine-pitch RDLs having pitches smaller than about 0.8 μm. In an embodiment, the heat spreader comprises a glass substrate or a metal substrate, and the first device die and the second device die are attached to the heat spreader through a thermal interface material. In an embodiment, the heat spreader comprises a blank bulk silicon substrate, and the method further comprises: forming a first plurality of bond pads extending into the blank bulk silicon substrate; and forming a second plurality of bond pads extending into semiconductor substrates of the first device die and the second device die, wherein the attaching comprises a hybrid bonding.

In accordance with some embodiments of the present disclosure, a device includes a blank substrate; a first device die and a second device die bonded to the blank substrate; a gap-filling material comprising: a first portion filling a gap between the first device die and the second device die; and a second portion covering the first device die and the second device die; vias penetrating through the second portion of the gap-filling material to electrically couple to the first device die and the second device die; a plurality of dielectric layers over the gap-filling material; and a plurality of redistribution lines in the plurality of dielectric layers, wherein the plurality of redistribution lines comprises dual damascene structures. In an embodiment, the device includes one of the dual damascene structures comprises: a via and a metal line over and continuously connected to the via, wherein the via and the metal line in combination comprises: a diffusion barrier layer extending into both the via and the metal line; and a copper-containing material over the diffusion barrier layer. In an embodiment, the device further includes a first dielectric layer on a surface of the blank substrate; a second dielectric layer on a surface of the first device die, wherein the first dielectric layer is bonded to the second dielectric layer through dielectric-to-dielectric bonding; a first metal pad in the first dielectric layer; and a second metal pad in the second dielectric layer, wherein the first metal pad is bonded to the second metal pad through metal-to-metal bonding. In an embodiment, the device includes the gap-filling material is an oxide. In an embodiment, the device includes no polymer exists between the blank substrate and the plurality of dielectric layers.

In accordance with some embodiments of the present disclosure, a device includes a heat spreader; a first oxide layer over the heat spreader; a first device die over and bonded to the heat spreader through the first oxide layer; a dielectric gap-filling material encircling the first device die; a plurality of low-k dielectric layers over the dielectric gap-filling material; a plurality of metal lines and vias in the plurality of low-k dielectric layers, wherein the plurality of metal lines and vias are electrically connected to the first device die; and a plurality of solder regions over and electrically coupling to the plurality of metal lines and vias. In an embodiment, the device includes the plurality of metal lines and vias comprise dual damascene structures. In an embodiment, the device includes the dielectric gap-filling material further comprises a top portion overlapping the first device die, and the device further comprises a conductive via penetrating through the top portion of the dielectric gap-filling material to electrically couple to the first device die. In an embodiment, the device further includes a second oxide layer over the heat spreader; and a second device die over and bonded to the heat spreader through the second oxide layer, wherein the plurality of metal lines and vias electrically intercouples the first device die and the second device die. In an embodiment, the device further includes a third oxide layer on a surface of the first device die, wherein the third oxide layer is bonded to the first oxide layer. In an embodiment, the device further includes a first bond pad extending into the first oxide layer; and a second bond pad extending into the third oxide layer, wherein the first bond pad is further bonded to the second bond pad. In an embodiment, the device includes the first bond pad further extends into the heat spreader. In an embodiment, the device includes the first device die comprises a semiconductor substrate, and the second bond pad further extends into the semiconductor substrate. In an embodiment, the device includes each of the first bond pad and the second bond pad forms a grid.

In accordance with some embodiments of the present disclosure, a device includes a heat spreader; a first device die and a second device die over and attached to the heat spreader; a dielectric gap-filling material encapsulating the first device die and the second device die therein; vias penetrating through the dielectric gap-filling material to electrically couple to the first device die and the second device die; a plurality of redistribution lines over and electrically coupling to the vias, wherein the redistribution lines comprise dual damascene structures; and a plurality of electrical connectors electrically coupling to the plurality of redistribution lines. In an embodiment, the device includes the heat spreader comprises a semiconductor material. In an embodiment, the device includes the first device die comprises a semiconductor substrate, and wherein the first device die is bonded to the heat spreader through a metal pad, and the metal pad extends into the semiconductor substrate of the first device die. In an embodiment, the device includes the heat spreader is formed of a metal. In an embodiment, the device includes the vias are in contact with aluminum pads of the first device die. In an embodiment, the device includes one of the vias is in contact with a top metal pad of the first device die, and the top metal pad is in a low-k dielectric layer.

In accordance with some embodiments of the present disclosure, a method includes bonding a first device die and a second device die to a blank substrate; forming an oxide layer to fill a gap between the first device die and the second device die; forming redistribution lines over the oxide layer, wherein the first device die and the second device die are electrically intercoupled through the redistribution lines; forming electrical connectors over and electrically coupling to the redistribution lines; and sawing through the blank substrate and the oxide layer to form a plurality of packages, wherein the first device die and the second device die are in one of the plurality of packages. In an embodiment, the bonding comprises a fusion bonding. In an embodiment, the bonding further comprises metal-to-metal direct bonding. In an embodiment, the bonding is performed through a thermal interface material. In an embodiment, the blank substrate is a semiconductor substrate, with no active device formed on the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a first device die comprising:
        a semiconductor substrate;
        a first dielectric layer underlying and contacting the semiconductor substrate; and
        a first bond pad extending into the first dielectric layer, with a first bottom surface of the first dielectric layer and a second bottom surface of the first dielectric layer being coplanar;
    a gap-filling material comprising:
        a first portion encircling the first device die and contacting sidewalls of the first device die; and
        a second portion covering the first device die;
    vias penetrating through the second portion of the gap-filling material to electrically couple to the first device die, wherein sidewalls of the vias are in contact with the second portion of the gap-filling material;
    a plurality of dielectric layers over the gap-filling material;
    a plurality of metal lines in the plurality of dielectric layers; and
    a plurality of vias interconnecting the plurality of metal lines, wherein the plurality of metal lines and the plurality of vias comprise dual damascene structures.

2. The structure of claim 1, wherein the first device die comprises:
    a first conductive pad;
    a passivation layer over the first conductive pad;
    a second conductive pad over the passivation layer;
    a first via extending from a top surface of the second portion of the gap-filling material to contact the first conductive pad; and
    a second via extending from the top surface to contact the second conductive pad.

3. The structure of claim 1, wherein the first device die and the gap-filling material are free from polymers.

4. The structure of claim 1 further comprising:
    a second dielectric layer bonding to the first dielectric layer;
    a second bond pad extending into the second dielectric layer and bonding to the first bond pad; and
    a blank substrate underlying the second dielectric layer and the second bond pad, wherein the blank substrate is free from active devices and passive devices therein.

5. The structure of claim 1, wherein the first bond pad has a shape of a grid.

6. The structure of claim 1, wherein one of the dual damascene structures comprises:
    a via and a metal line over and continuously connected to the via, wherein the via and the metal line in combination comprises:
        a diffusion barrier layer extending into both of the via and the metal line; and
        a copper-containing material over the diffusion barrier layer.

7. The structure of claim 1, wherein the gap-filling material comprises an oxide.

8. A structure comprising:
a substrate;
a first dielectric layer over and contacting the substrate;
a first bond pad extending into the first dielectric layer and the substrate;
a device die comprising:
a conductive pad; and
a passivation layer comprising a portion over the conductive pad;
a dielectric gap-filling material encapsulating the device die, wherein a portion of the dielectric gap-filling material overlaps the device die, and wherein a top surface of the first dielectric layer is further in contact with the dielectric gap-filling material;
a via over and contacting a top surface of the conductive pad, wherein the via comprises a straight and vertical sidewall penetrating through the dielectric gap-filling material and the passivation layer;
a plurality of low-k dielectric layers over the dielectric gap-filling material;
a plurality of metal lines and vias in the plurality of low-k dielectric layers, wherein the plurality of metal lines and vias are electrically connected to the device die, and the plurality of metal lines and vias form damascene structures; and
a plurality of electrical connectors over and electrically coupling to the plurality of metal lines and vias.

9. The structure of claim 8, wherein the device die further comprises:
a semiconductor substrate;
a second dielectric layer between and bonding to the first dielectric layer the semiconductor substrate; and
a second bond pad extending into the second dielectric layer, wherein the second bond pad is bonded to the first bond pad.

10. The structure of claim 8, wherein the substrate comprises a semiconductor material.

11. The structure of claim 8, wherein the dielectric gap-filling material comprises an oxide.

12. The structure of claim 8, wherein from a top surface of a top dielectric layer in the plurality of low-k dielectric layers to a bottom surface of the device die, there is no polymer.

13. A structure comprising:
an oxide layer;
a first device die and a second device die, both over and bonding to the oxide layer, wherein the first device die comprises a semiconductor substrate;
a dielectric gap-filling material encapsulating the first device die and the second device die therein;
vias penetrating through the dielectric gap-filling material to electrically couple to the first device die and the second device die;
a plurality of dielectric layers over the vias, wherein the dielectric gap-filling material and the plurality of dielectric layers are formed of inorganic dielectric materials;
a plurality of redistribution lines over and electrically coupling to the vias, wherein the redistribution lines comprise dual damascene structures, and wherein the redistribution lines are in the plurality of dielectric layers; and
a plurality of electrical connectors electrically coupling to the plurality of redistribution lines.

14. The structure of claim 13, wherein the first device die comprises:
a first conductive pad;
a passivation layer over the first conductive pad; and
a second conductive pad over the passivation layer, wherein the vias comprise a first via and a second via, each penetrating through the dielectric gap-filling material, and wherein the first via physically contacts the first conductive pad, and the second via physically contacts the second conductive pad.

15. The structure of claim 14, wherein the first via comprises a first straight edge extending from a top surface of the dielectric gap-filling material to the first conductive pad, and the second via comprises a second straight edge extending from the top surface of the dielectric gap-filling material to the second conductive pad.

16. The structure of claim 13 further comprising a plurality of low-k dielectric layers, wherein the plurality of redistribution lines are in the plurality of low-k dielectric layers.

17. The structure of claim 13, wherein the first device die and the second device die are free from polymers.

18. The structure of claim 4, wherein the blank substrate comprises a micro trench therein.

19. The structure of claim 8, wherein the substrate comprises a micro trench therein, wherein the micro trench comprises a first end and a second end, and wherein both of the first end and the second end extend to a bottom surface of the substrate.

20. The structure of claim 13, wherein an entire part of the structure extending from a top surface of a top dielectric layer in the plurality of dielectric layers to a bottom surface of the first device die is free from polymer therein.

* * * * *